(12) United States Patent
Ogura et al.

(10) Patent No.: US 8,710,576 B2
(45) Date of Patent: Apr. 29, 2014

(54) HIGH DENSITY VERTICAL STRUCTURE NITRIDE FLASH MEMORY

(75) Inventors: Seiki Ogura, Hillsboro, OR (US); Tomoko Ogura Iwasaki, Hillsboro, OR (US); Nori Ogura, Hillsboro, OR (US)

(73) Assignee: Halo LSI Inc., Hillsboro, OR (US)

( * ) Notice: Subject to any disclaimer, the term of this patent is extended or adjusted under 35 U.S.C. 154(b) by 597 days.

(21) Appl. No.: 12/378,108

(22) Filed: Feb. 11, 2009

(65) Prior Publication Data

US 2009/0200603 A1    Aug. 13, 2009

Related U.S. Application Data

(60) Provisional application No. 61/065,430, filed on Feb. 12, 2008.

(51) Int. Cl.
*H01L 29/792* (2006.01)

(52) U.S. Cl.
USPC ..... 257/324; 257/328; 257/330; 257/E27.085

(58) Field of Classification Search
USPC .................. 257/314, 324, 328, 330, E27.085
See application file for complete search history.

(56) References Cited

U.S. PATENT DOCUMENTS

| | | | |
|---|---|---|---|
| 5,563,083 A | 10/1996 | Pein | |
| 5,780,341 A | 7/1998 | Ogura | |
| 6,011,725 A | 1/2000 | Eitan | |
| 6,091,102 A | 7/2000 | Sekariapuram et al. | |
| 6,248,633 B1 | 6/2001 | Ogura et al. | |
| 6,563,736 B2 | 5/2003 | Hsu et al. | |
| 7,064,382 B2 | 6/2006 | Kodama et al. | |
| 7,132,335 B2 | 11/2006 | Ilkbahar et al. | |
| 7,157,771 B2 | 1/2007 | Forbes | |
| 2004/0031984 A1* | 2/2004 | Kianian et al. | 257/314 |
| 2006/0043457 A1* | 3/2006 | Baik | 257/314 |
| 2006/0124998 A1* | 6/2006 | Prall et al. | 257/330 |
| 2008/0087942 A1* | 4/2008 | Hsu et al. | 257/324 |
| 2008/0296659 A1* | 12/2008 | Park et al. | 257/324 |

FOREIGN PATENT DOCUMENTS

WO  PCT/US2009/000905    4/2009

OTHER PUBLICATIONS

"Multi-level p+ tri-gate SONOS NAND string arrays," by C. Friederich et al., 966-IEDM 06, 2006 IEEE, 37.2.1-37.2.4.
"Highly Scalable Verical Double Gate NOR Flash Memory," by Hoon Cho et al., 920-IEDM 07, 35.2.1-35.2.4.

* cited by examiner

*Primary Examiner* — Eduardo A Rodela
(74) *Attorney, Agent, or Firm* — Saile Ackerman LLC; Stephen B. Ackerman; Rosemary L. S. Pike

(57) ABSTRACT

A charge trap type of memory having a memory channel with vertical and possibly horizontal components is described. The invention includes a new operation method of simultaneous hole and electron injection operation for high speed and high reliability non-volatile memories, as well as high-density non-volatile memories. Array implementations for high-density memory arrays and high-speed memory arrays and their fabrication methods are also described.

18 Claims, 14 Drawing Sheets

HIGH DENSITY VERTICAL STRUCTURE NITRIDE FLASH MEMORY

This application claims benefit of U.S. Provisional application Ser. No. 61/065,430, filed on 12 Feb. 2008 and herein incorporated by reference in its entirety.

BACKGROUND OF THE INVENTION

1. Field of the Invention

The present invention is related to nonvolatile memories in general, and in particular, to a high-density memory element composed of trapped-charge film, being implemented with a thin body and vertical channel memory device.

2. Description of Related Art

High-density memories having two bits per cell stored in the nitride layer of ONO films or charge trap memories have been previously described in U.S. Pat. No. 6,248,633, shown in FIG. 1 and U.S. Pat. No. 6,011,725, shown in FIG. 2. In FIG. 1, the Twin MONOS device has a word gate 17 surrounded by two sidewall control gates 15 and 16. Under the control gates 15 and 16 are two memory regions 13 and 14 next to the source and drain regions 11 and 12. In FIG. 2, the memory region 23 is a single film in which charge can be stored on both edges under a control gate 24, between a source and a drain 21 and 22. Both of these patents refer to memory types that utilize a planar substrate, in that the channel region under the memory control gates is horizontal and flat.

U.S. Pat. No. 5,780,341, shown in FIG. 3, refers to a floating gate device which utilizes a non-planar substrate. The device has a word gate 34 in series with a floating gate 33, between the source and drain regions 31 and 32. Under the floating gate 33, there is a small step, or vertical element in the substrate topography. By introducing a step into the channel, CHE program efficiency is enhanced because electrons can be injected directly into the floating gate 33, in the direction of momentum, rather than by scattering.

Qimonda's IEDM 2006 structure, shown in FIG. 4 refers to a NAND trap memory in which ONO 44 is deposited over an etched thin body substrate 43. A common gate 45 wraps around the device, above the source and drain 41 and 42.

Stanford's IEDM 2007 structure, shown in FIG. 5, also refers to a FINFET device in which the substrate is etched 53 so that the memory channel is vertical. The storage element in this device is a floating gate 54 and 55.

SUMMARY OF THE INVENTION

A principal object of the present invention is to provide a high-density memory element with a vertical channel region.

Another object of the invention is to provide a memory element wherein the two opposing memory channels within a pair is programmed and/or erased simultaneously.

A further object of the invention is to provide a memory element where programming involves the injection of electrons (electron injection) and erasing involves the injection of holes (hole injection).

Yet another object is to provide methods of array organization that provide high speed or high density or both.

A still further object is to provide methods of operation of a vertical memory device.

According to the objects of the invention, a memory device is achieved comprising two independent vertical memory gates formed in a first direction, a silicon substrate sandwiched between the two vertical memory gates wherein a face of the silicon substrate between the silicon substrate and the memory gate forms a memory gate channel region, source regions underlying the two vertical memory gates, drain regions in a top portion of the silicon substrate, a trench isolation formed between the drain regions in a second direction which provides isolation from an adjacent memory device in the second direction, and memory gate channel oxide formed between each source region and drain region and between each memory gate and silicon substrate wherein the memory gate channel oxide comprises a first trapping region and a second non-trapping region and wherein holes and/or electrons may be stored in the first trapping region.

Also according to the objects of the invention, a high-speed memory array is achieved comprising a plurality of memory devices as described above, organized in columns and rows, a bit line connecting drain regions alternately and running in the first direction, a control gate line connecting the vertical memory gates and running in the second direction, and a source line connecting the source regions and running in the second direction, parallel to the control gate line.

Also in accordance with the objects of the invention, a complementary program and erase operation on a pair of memory gates is achieved. A memory device is provided comprising two opposing memory gates, as described above, sharing a drain region and used as a complementary pair to store data in a complementary manner. The complementary pair of vertical memory gates is simultaneously programmed and erased by biasing the shared drain with a first positive voltage and biasing the pair of vertical memory gates with opposite polarity wherein a high electric field is created in the memory gate channel, wherein electrons and holes generated by impact ionization are drawn to their corresponding gates according to the polarity of the gate, and wherein electron and hole injection are achieved simultaneously.

Also in accordance with the objects of the invention, another memory device is achieved comprising two vertical memory gates formed in a first direction, two vertical select gates formed above the two vertical memory gates formed in a first direction, a silicon substrate sandwiched between the two vertical memory gates and the two vertical select gates wherein a face of the silicon substrate between the silicon substrate and the memory gate forms a memory gate channel region, source regions underlying the two vertical memory gates, drain regions in a top portion of the silicon substrate, a trench isolation formed between the vertical select gates in a second direction which provides isolation from a memory device adjacent in the second direction, a word gate line formed above and to connect to the vertical select gates, and memory gate oxide formed between the silicon substrate and the vertical memory gates wherein the memory gate channel oxide comprises a trapping region and wherein holes and/or electrons may be stored in the trapping region.

Also according to the objects of the invention, a high-density memory array is achieved comprising a plurality of memory devices as described above, organized in columns and rows, word gate lines connecting the vertical select gates and running in the first direction, drain bit lines connecting the drain regions and running in the second direction, and source lines connecting the source regions and running in the first direction, parallel to the word gate lines.

DETAILED DESCRIPTION OF THE PREFERRED EMBODIMENTS

This invention describes a charge trap type of memory having a memory channel with vertical and possibly horizontal components. Also, when the substrate width is very small, on the order of 50 nm or less, the two opposing memory channels within a pair should be programmed and/or erased simultaneously, where program involves the injection of electrons (electron injection) and erase involves the injection of holes (hole injection).

Device Description

Figure 1:
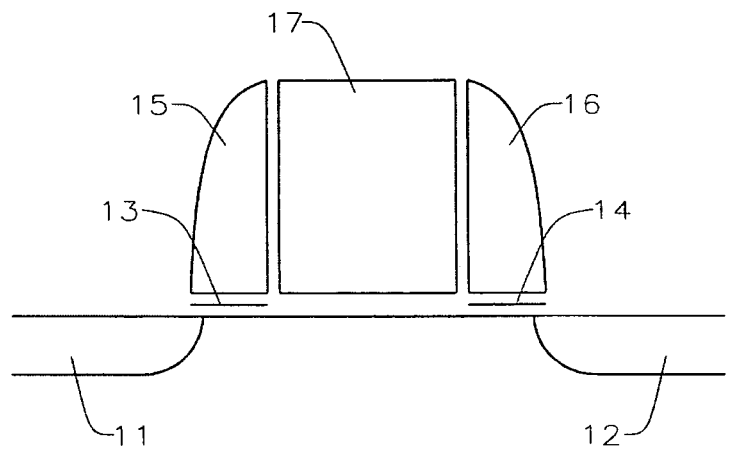
FIGS. 1 through 5 are cross-sectional representations of structures of the prior art.
Figure 2:
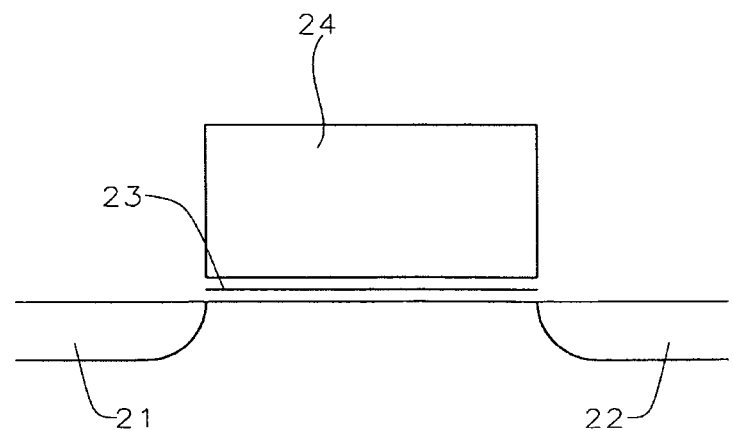
Figure 3:
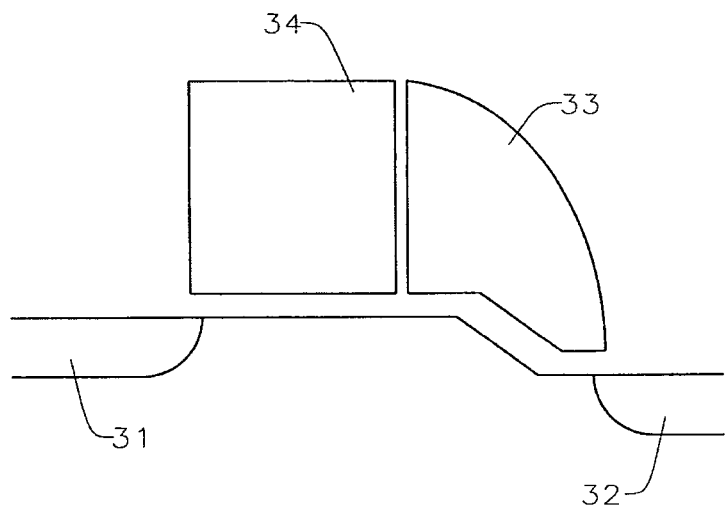
Figure 4:
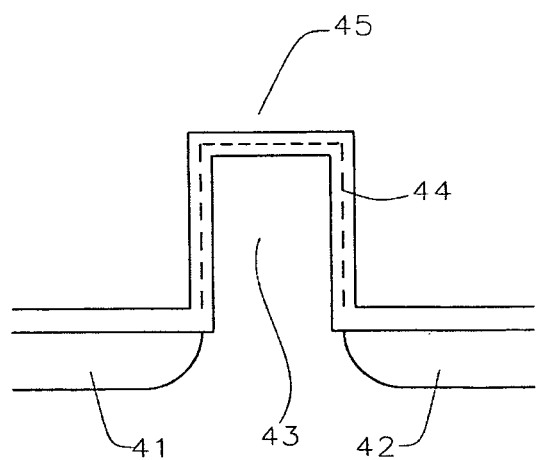
Figure 5:
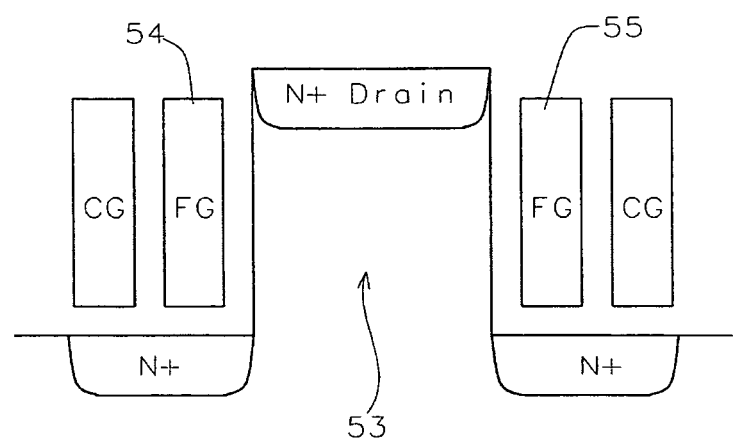
Figure 6:
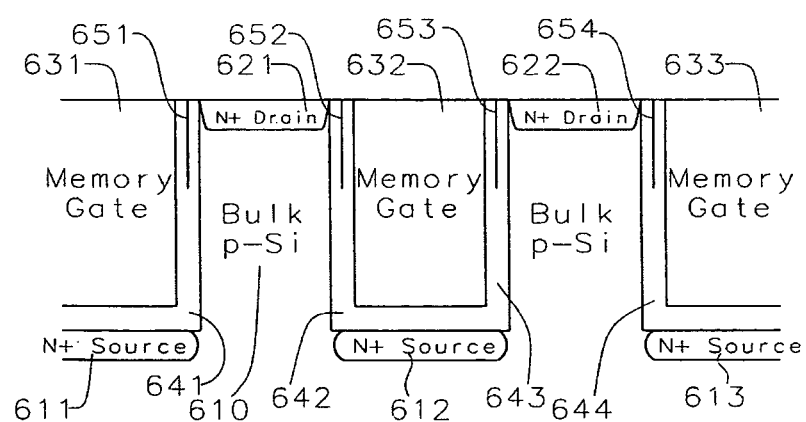
FIG. 6 shows a cross-sectional representation of the first embodiment of the present invention.

FIG. 6 shows an embodiment of the new memory device of the present invention. A row of memory cells is shown in which a thin silicon substrate 610 having a width of 50 nm or less is sandwiched between two vertical memory regions, an opposing pair of source regions 611 and 612 under an opposing pair of memory gates 631 and 632. The top drain regions 621 (and 622) are isolated from the adjacent devices in the next row by silicon oxide trench isolation to minimize interference with the neighboring cell. The gate dielectric on each side consists of two regions: a drain side composite insulator 651 and a source side non-trapping insulator 641.

It is also possible, and even in some applications, desirable, to control the thin silicon substrate to be in a slightly wider range of 50-100 nm, in order to store charge with more stability, depending on the VT window range of each opposing gate. In general, the greater the plus-minus charge difference between the two gates in an opposing gate pair, the wider the thin substrate body width should be. For example, if both gates store different levels of electrons, then the thin substrate width can be small, less than 50 nm. But if one gate stores electrons and the other gate stores holes, then the substrate width may need to be wider, around 80 nm. The reason is that the read signal Threshold voltage (Vt) of the electron-trap side is modulated by the storage of holes in the opposite memory gate. For each channel doping, there is an optimal bulk width. These dimensions are. approximate and chosen for illustrative purposes and should not be considered self-limiting in any way.

The interference through body effect between the two gates in an opposing pair can be reduced or prevented by biasing the unselected side. For example, if the electron side is being read, if –1V is applied to the gate of the unselected side which is storing holes, then interference is minimized.

Continuing to refer to FIG. 6, the sidewall channel region is a sidewall surface in a trench (641/651, 642/652).

The bulk silicon is trenched and sandwiched by the polysilicon gate (631 and 632) which fills the trench. The trench is filled with whatever gate material is used in the base process, such as doped polysilicon or refractory metal.

The width of the bulk silicon 610 can be defined by lithographic or sidewall techniques and can be on the order of 50-100 nm or less than 50 nm, which is several times the carrier escape length, or Debye length. The silicon 610 forms the memory gate channel region. High energy carriers during program and erase operation are contained within the thin body so that they can be injected ballistically, without scattering.

The top silicon region is doped with N+ and becomes the drain of the n-channel device (621 and 622). This drain region can be isolated and individual.

The bottom of the trench is doped with N+ and is used as the source of the device (611 and 612). This source may or may not be shared with the adjacent cell's source.

The sidewall channel consists of two regions: (a) the vertical channel near the bottom (641, 642, 643) is composed of a trap free insulator such as thermal oxide to ensure the off condition regardless of trapped charge polarity and to prevent high energy carriers from escaping from the thin body to the bulk, and (b) the adjacent channel region (651, 652, 653), which becomes the memory stack, and is covered by composite insulator layers consisting of three dielectric layers, in which the middle layer, represented by the vertical line, has the lowest work function and contains trapping sites.

One example of this composite layer is $SiO_2$—$SiN$—$SiO_2$. SiN can also be substituted with other films such as Hf oxide, HfSiO, or other metal oxides. The memory channel length, referring to the vertical length of the composite layer 651, can be as low as 30-50 nm or less, or it can be longer, depending on the application.

Figure 7A:
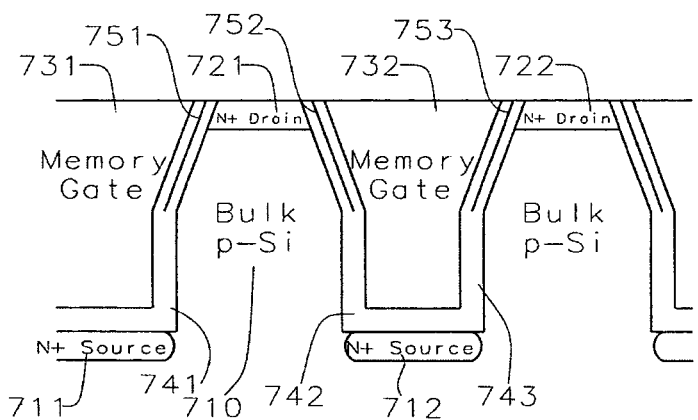
FIG. 7A shows a cross-sectional representation of the second embodiment of the present invention.

The memory gate channel region can be directly in line with the bottom non-memory channel, as according to FIG. 6, or it can also be fabricated to slant at an angle towards the N+ drain region, as shown in FIG. 7A. By introducing such a slant angle, injection efficiency improves significantly. Numbered areas of FIG. 7A beginning with '7' are the same as the corresponding areas of FIG. 6 beginning with '6.'

Figure 7B:
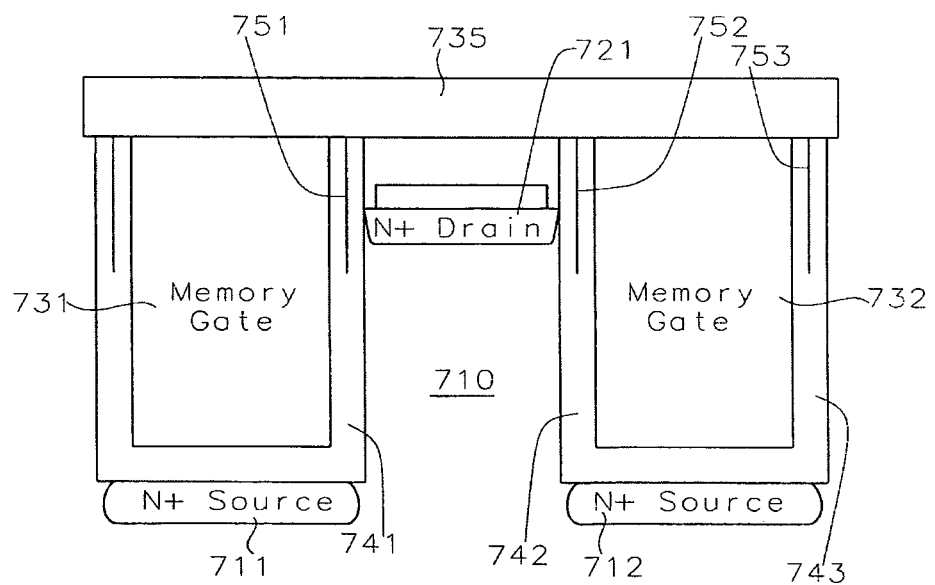
FIG. 7B shows a cross-sectional representation of the third embodiment of the present invention.

FIG. 7B shows another cross-section variation in which the top N+ drain 721 is recessed by selective etching so that the memory gate polysilicon 735 can run over the top. In this way, the normal metal and silicide flow does not need to be impacted. This memory array is also more compact and provides higher density.

Figure 7C:
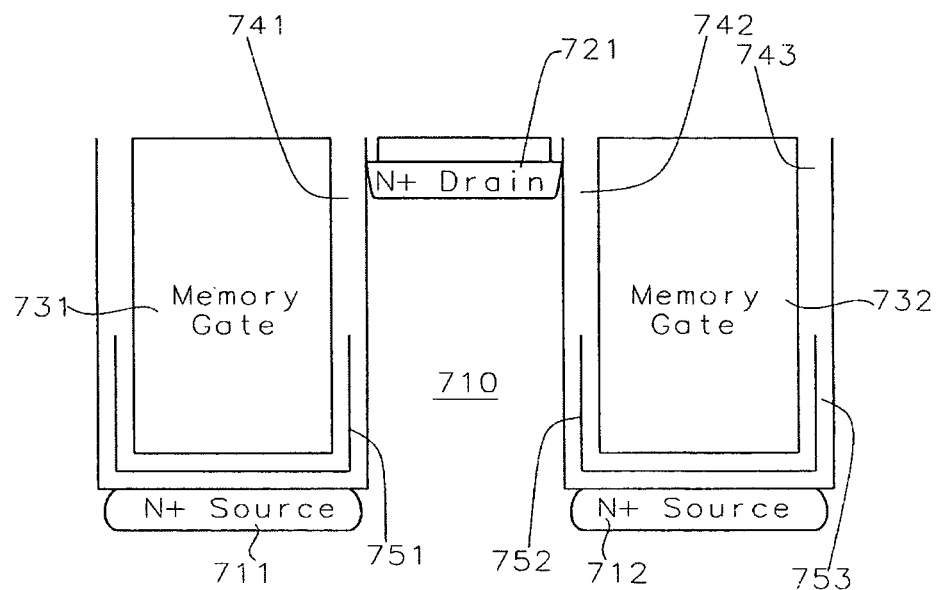
FIG. 7C shows a cross-sectional representation of the fourth embodiment of the present invention.

FIG. 7C shows another cross-section variation in which the memory ONO channel (751, 752) is close to the N+ source (711, 712) instead of close to the N+ drain side 721.

Figure 7D:
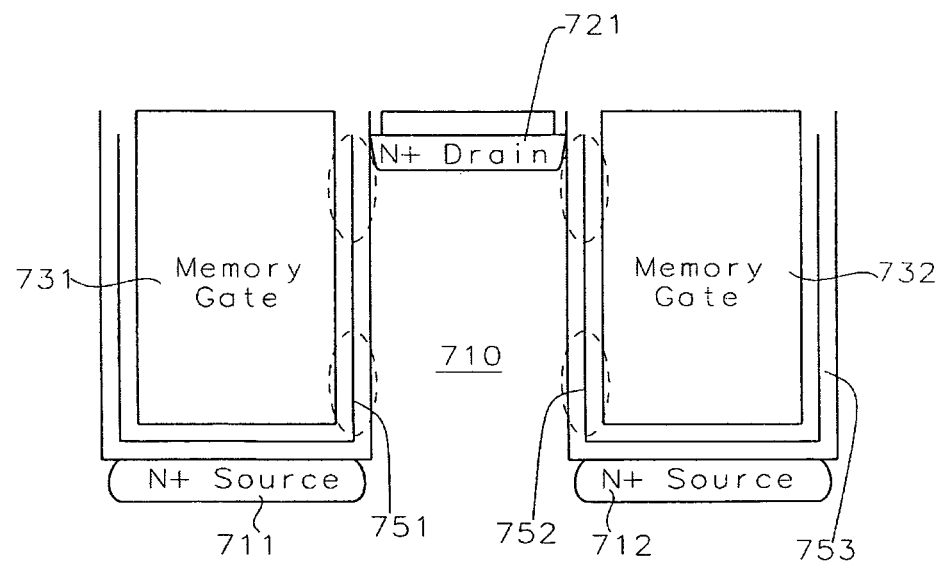
FIG. 7D shows a cross-sectional representation of the fifth embodiment of the present invention.

FIG. 7D shows another cross-section variation in which the entire channel between the source and drain is a memory ONO channel (751, 752). In this device, both sides of the ONO channel can be used to store two separate bits of data.

Figure 7E:
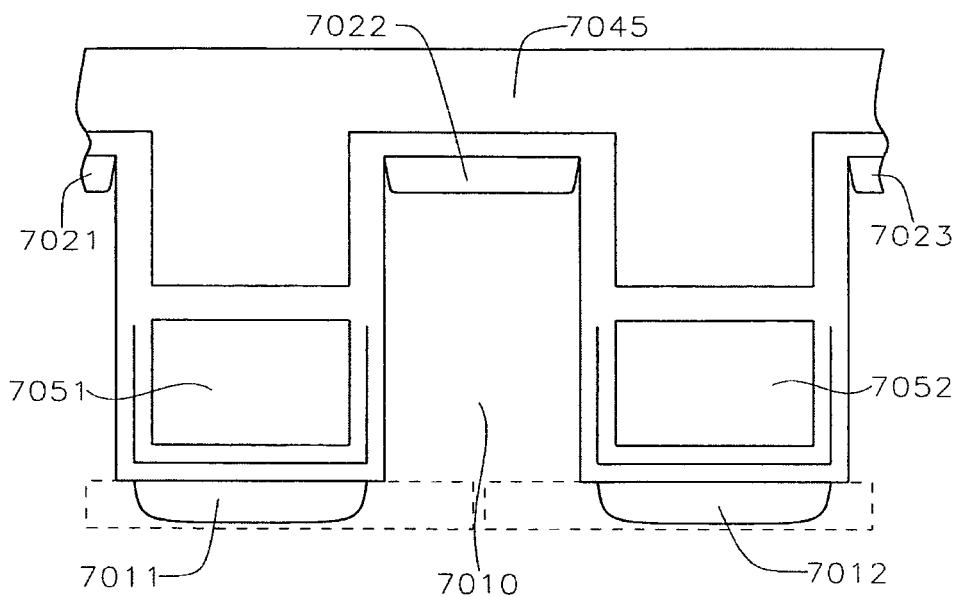
FIG. 7E and FIG. 7F show a cross-sectional representation of the sixth embodiment of the present invention.

FIG. 7E shows another cross-section variation in which two polysilicon gates are formed within a single trench. The memory ONO film lies under the bottom gates 7051 and 7052. N+ sources 7011 7012 are formed at the bottom of the trench, and by choosing the proper processing conditions, the N+ sources of neighboring cells can be outdiffused so that they connect. The upper polysilicon gate is the word gate 7045, which acts as a select gate to the memory device. N+ drain diffusions 7021, 7022, 7023 are formed at the top of the thin bulk silicon.

Figure 7F:
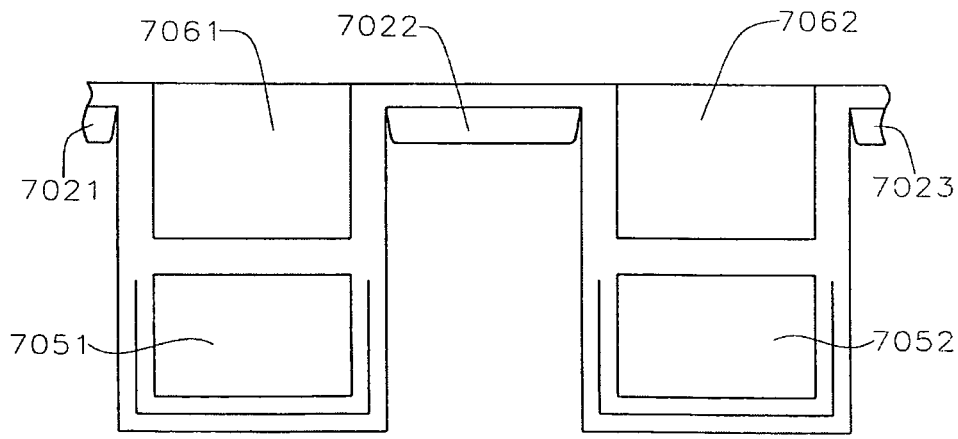

FIG. 7F shows the cross-section between rows of the same memory device as in FIG. 7E. The drain diffusions are separated by isolation trenches 7061, 7062.

Figure 8:
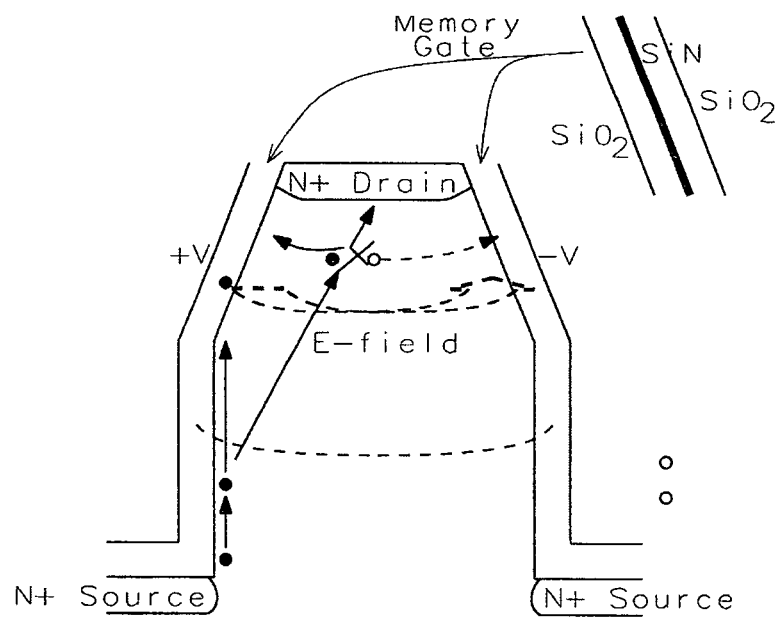
FIG. 8 shows a cross-sectional representation of the second embodiment of the present invention, with a further description of the electric fields.

FIG. 8 illustrates the electric field for simultaneous complementary injection of holes and electrons to two opposing memory regions within a single trench device. The left side memory region is being programmed with electrons. High energy electrons travel from the N+ source to the N+ drain, and impact ionization occurs at the edge of the N+ drain, which creates both holes and electrons. Since the silicon body is very narrow, biasing of the opposite gate to a negative voltage will sweep the holes towards the memory region under that negatively-biased gate. Electrons will be swept towards the memory region under the positively biased gate. Thus, a stable simultaneous complementary program/erase may be obtained.

This memory device can be used and arranged in many different ways. Two examples are described in detail.

Figure 10A:
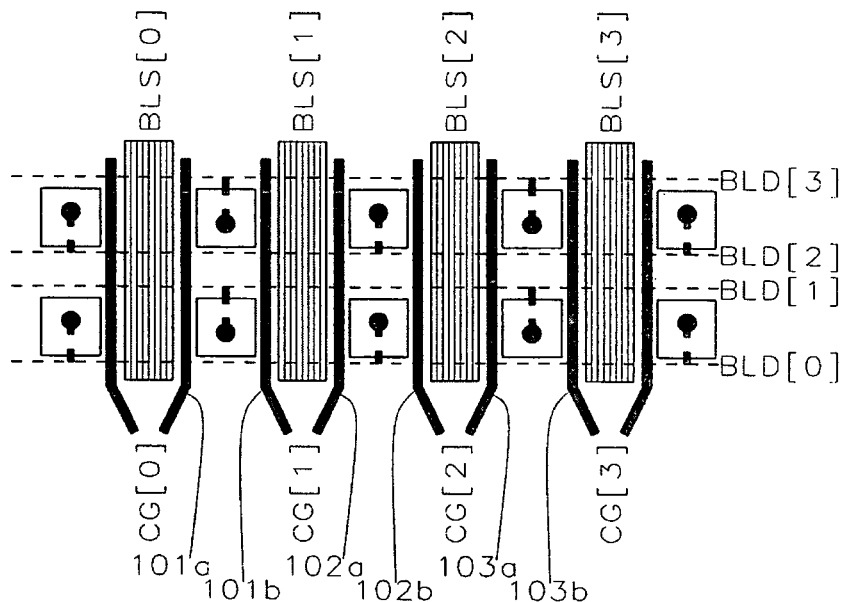
FIG. 10A shows a second type of layout representation of the present invention, corresponding to the cross-section given in FIG. 7B.

FIG. 10A shows a high density memory array. Here, the topside N+ drains BLD [0,1,2,3] are connected in a vertical direction, with possibly an extra layer of silicide, polysilicon or metal. The bottom source N+ lines BLS [0,1,2,3] are shown to run in the same vertical direction. But they may also be individually connected to a ground plane. The memory gate in each cell is individual, but connected by more gate material (either the same polysilicon or another layer or either polysilicon or contact or metal), such that the memory gate line CG [0,1,2,3] runs orthogonal to the BLS's.

Figure 10B:
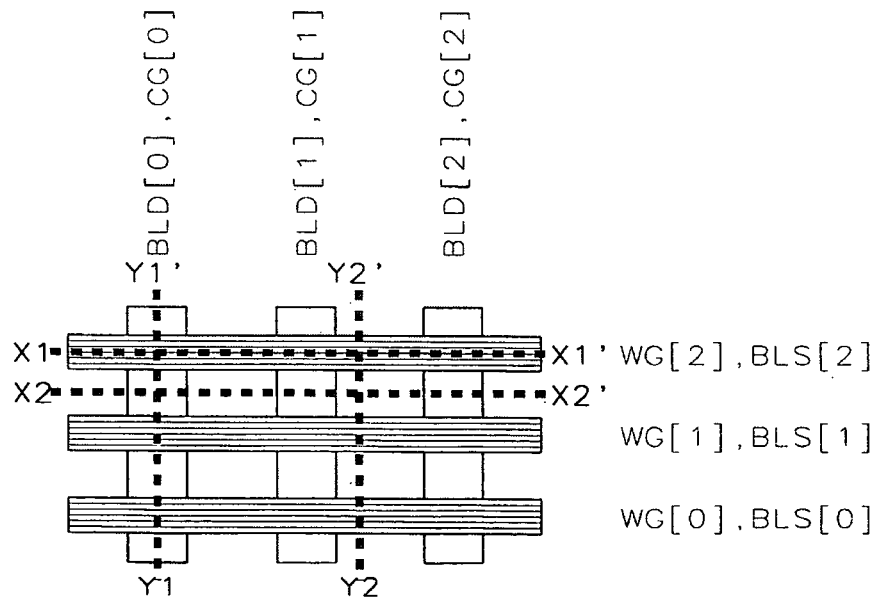
FIG. 10B shows a third type of layout representation of the present invention, corresponding to the cross-section given in FIG. 7E.

FIG. 10B shows another high density memory array based on the memory device illustrated in FIG. 7E. Topside N+ drains BLD[0.1.2] are connected in a first direction that runs underneath and in parallel to CG gates CG[0,1,2]. The word gate is connected in a second direction that is orthogonal to the BLD and CG gates, and in parallel to the source line. The complementary injection method can be applied to this type of memory array.

Figure 9:
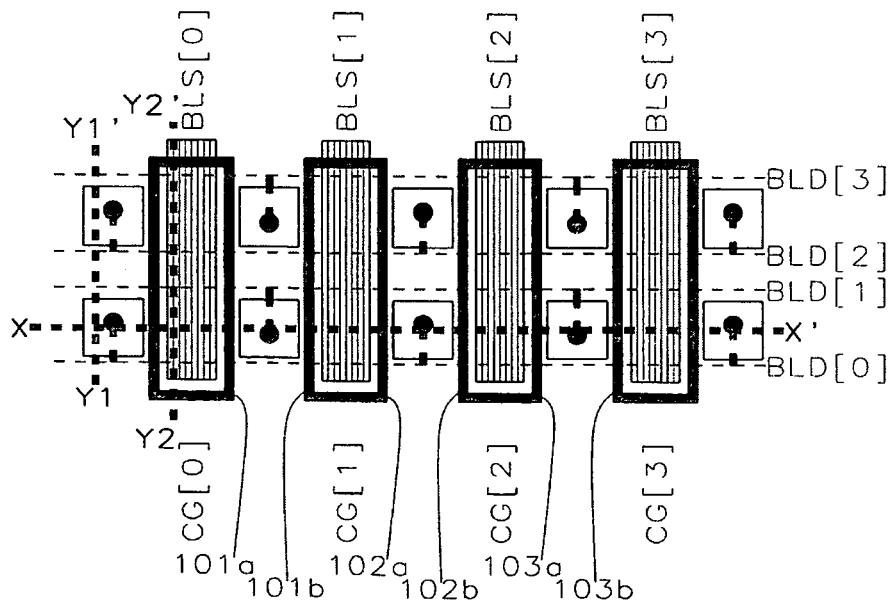
FIG. 9 shows a first type of layout representation of the present invention, corresponding to the cross-section given in FIG. 6.

In FIG. 9, a high-speed array with a relatively simple process is shown. Here, the memory gates, shown in wider dark lines, run in parallel with the bottom N+ source bit lines BLS [0,1,2] (as shown in FIG. 6, for example). The topside N+ drains BLD [0,1,2] are alternately contacted to metals which run perpendicular to the CG's and BLS's. The metal drain lines enable high speed operation, but come at an area cost. Each row of memory cells has two drain lines, for example, row 1 has BLD [0] and BLD [1]. The drain lines could be could be implemented on the same level of metal, but may also be implemented using different levels in a serpentine shape, which could improve the memory cell density by a factor of 2. There are different ways to group cells in pairs, here we provide two ways, the complementary pair and the opposing pair. The memory gates in a complementary pair are given as 101a and 101b, 102a and 102b, 103a and 103b, etc. And the memory gates in an opposing pair would be 100b and 101a, 101b and 102a, 102b and 103a, etc.

Figures 11, 12:
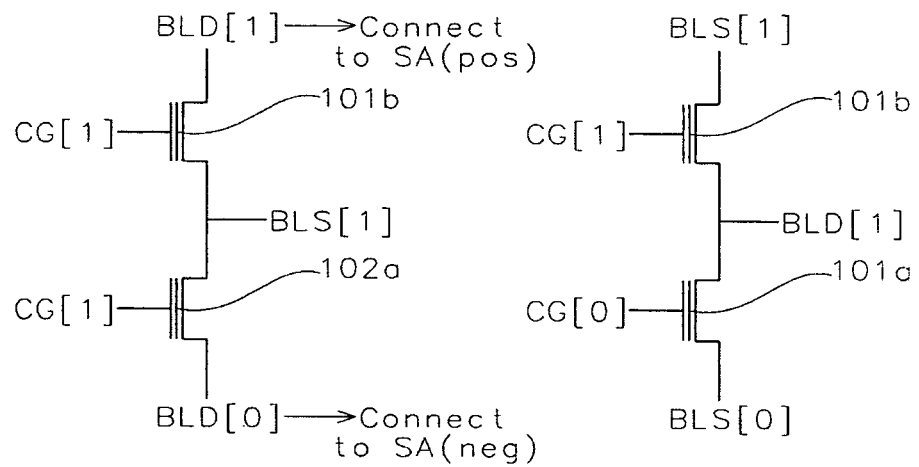
FIG. 11 shows a pair grouping which references the array from FIG. 9.
FIG. 12 shows an inverter pair grouping which references the array from FIG. 9.

In this array, as in any conventional memory, each memory gate can be used to store individual data that is independent of the state of the opposing pair. However, utilizing two memory gates as a pair, as shown in FIG. 11 or FIG. 12, can give advantages in speed and cycling capability. For example, a pair of memory gates 101a and 101b may store a data of "1" when the left memory gate 101a is programmed, and the right memory gate 101b is erased; and the same pair of memory gates may store a data of "0" when the left memory gate 101a is erased and the right memory gate 101b is programmed. By storing data in such a complementary fashion, the memory gates are self-referencing, which eliminates the need for complicated referencing circuits. FIG. 11 shows an example of such an implementation, in which the memory cell 101a and 101b refer to the same memory cells given in the array of FIG. 10A.

Voltage tables are given below for the memory pair groupings of FIG. 11, FIG. 12, and FIG. 13, in Table 1, Table 2, Table 3, respectively. In each table, Vread refers to an arbitrary voltage that is applied to the CG gates during read.

| Complementary Pair - self referencing 2 bit lines | | | | |
|---|---|---|---|---|
| Row | Mode | BLS[1] | CG[1] | BLD[0] | BLD[1] |
| 1 | Read | 0 | Vread | Sense(!BL) | Sense(BL) |
| 2 | PGM 0 | 0 | 5 | 0 | 5 |
| 3 | BLD[1] = hi | 0 | −3 | 5 | 0 |
| 4 | PGM 1 | 0 | −3 | 0 | 5 |
| 5 | BLD[1] = lo | 0 | 5 | 5 | 0 |

This figure, as well as the next two that follow, should not be self-limiting. There are many ways to choose complementary gates; it is not always best to choose the two cells closest to each other. Actually, when layout symmetry considerations are taken into account, the more optimal grouping would be to choose the memory gates that have the same 180 orientation and left/right BLD contact orientation. Furthermore, the thin substrate body width should be wide enough to minimize any cross-interference body effect that may occur between the gates in a physically opposing pair of gates. (In general, the greater the plus-minus charge difference between the two gates, the wider the thin substrate body width should be.)

FIG. 12 shows an example of memory gate grouping and voltage application in order to achieve a non-volatile inverter where the output BLD [1] can switch between 0 and the power supply VDD, depending on the states of the memory devices. It should be noted that due to forward read, the drain induced barrier lowering that occurs at the drain node BLS [1] from the application of a high voltage VDD when the top device 101b is programmed high, leakage may occur. Care should be taken to program that top device 101b extra high. Also it is important to ensure that the same memory gate channel is long enough to suppress leakage.

| Inverter latch - single opposing pair | | | | | |
|---|---|---|---|---|---|
| Mode | BLS[0] | BLS[1] | CG[0] | CG[1] | BLD[1] |
| Read | 0 | VDD | Vread | Vread | =hi (~VDD) when data = 0<br>=lo (~0 V) when data = 1 |
| PGM 0<br>BLD[1] = hi | 0 | 0 | 5 | −3 | 5 |
| PGM 1<br>BLD[1] = lo | 0 | 0 | −3 | 5 | 5 |

Figure 13:
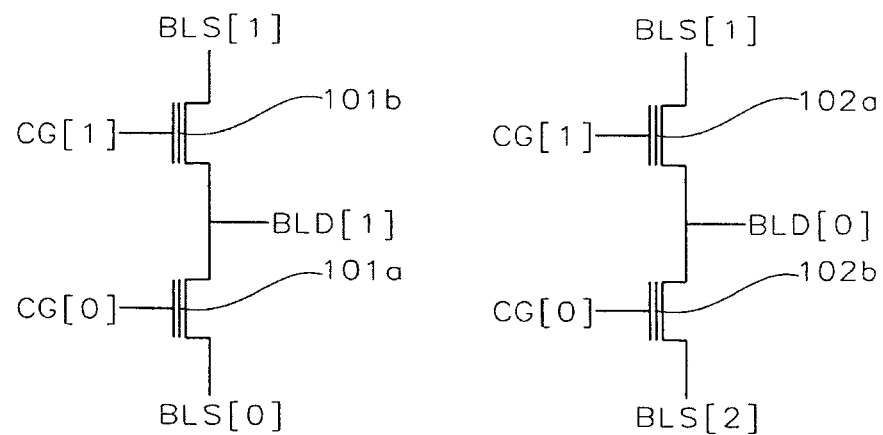
FIG. 13 shows an inverter pair latch grouping which references the array from FIG. 9.

If two complementary pairs are used together, a SRAM-like latch device can be achieved, as shown in FIG. 13, in order to achieve the highest speed read time.

| Inverter latch - complementary bit lines | | | | | | | |
|---|---|---|---|---|---|---|---|
| Mode | BLS[0] | BLS[1] | BLS[2] | CG[0] | CG[1] | CG[2] | BLD[0] | BLD[1] |
| Read | 0 | VDD | 0 | Vread | Vread | Vread | Sense | Sense |
| PGM 0 BLD[1] = hi | 0 | 0 | 0 | 5 | −3 | 0 | 0 | 5 |
| PGM 0 BLD[0] = lo | 0 | 0 | 0 | 0 | 5 | −3 | 5 | 0 |
| PGM 1 BLD[1] = lo | 0 | 0 | 0 | −3 | 5 | 0 | 0 | 5 |
| PGM 1 BLD[0] = hi | 0 | 0 | 0 | 0 | −3 | 5 | 5 | 0 |

Device Operation

The basic program mechanism is hot electron injection and the erase mechanism is hot hole injection. Both of these injection mechanisms are generally inefficient compared to other conventional means of program such as tunneling. However, in this novel structure, because of the small geometries and because the substrate is contained in a very thin body, injection efficiency is improved by orders of magnitude. Also, program and erase should be done simultaneously upon a memory gate pair.

Two memory gates that share a drain region, referred to from now on as opposing gates, can be utilized as individual memory regions in order to achieve the highest possible density. Or they may also be utilized as a self-referencing complementary pair in order to achieve faster read speed performance or cycling endurance.

In conventional operation, both memory sides are first erased by hot hole injection and then program is done independently on each side. For hot hole injection, a negative voltage of about −3V is applied to both gates and the drain voltage of about 4.5V is pulsed. Furthermore, the following voltage condition: 0V applied to the source, 4.5V applied to the drain, 0V or a negative voltage applied to the select gate, When the memory channel is slanted, during program, accelerated channel electrons in the drain field can be injected straight without phonon scattering due to the slanted (negative angle ~20 degree) memory channel, which provides extremely high injection efficiency.

A new operation of the present invention is complementary program and erase on a pair. Erase and program can also be conducted simultaneously on a complementary pair of opposing gates. If the left and right gates are biased with opposite polarity, a high horizontal electric field is created in the silicon bulk. When the energy of the incoming electrons is high enough to cause impact ionization, electrons and holes generated by the impact ionization will be drawn to their corresponding gates according to the polarity of the gate (electrons to the positive gate and holes to the negative gate). Since the bulk region is depleted, energy loss due to charge-to-charge collisions is minimized (ballistic injection). Also the horizontal field can be much stronger than the electric S/D field. Thus the injection efficiency can be significantly enhanced, allowing voltage reduction and high-speed program. Thus electron and hole injection can be achieved simultaneously, which is helpful, especially for small geometries when the silicon bulk is on the order of 50 nm or less, because it becomes very difficult to program a single memory gate independently without disturbing the charge stored on the opposite gate.

Another new operation of the present invention is a multiplication factor for high sensitivity program. By increasing the potential on drain and the two opposite gates between the two sidewall control gates, the multiplication factor of the impact ionization can be adjusted. This multiplication factor control can also be used to amplify a small number of electrons in the channel that would normally be difficult to detect. All of this can be achieved without affecting the adjacent cell because the cell drain region is isolated individually.

Referring to the high density memory device shown in FIG. 7E and the array organization given in FIG. 10B, program of a single memory region can be implemented as follows: The source line coupled to the selected memory region is biased to a high voltage of near 5V, and the selected memory gate is also biased to a voltage of around 4V. The drain diffusion is biased to 0V, and the word select gate is raised to some high voltage, around 2V. In order to inhibit program in the unselected opposing memory region which shares the same drain diffusion, the opposing memory gate is biased to a lower voltage of around 0-2.5V. The memory devices in the neighboring row which shares the same high memory gate voltage will be effectively inhibited by biasing the source line (which is not shared between rows) to a voltage of about 0V.

Fabrication Method

Fabrication methods will be described for both a high-speed memory array, as shown in FIG. 9, and a high density memory array, as shown in FIG. 10B.

FIGS. 14A-14J, describe the fabrication method of the high-performance array shown in FIG. 9, along the X-X' cross-section line, based on the memory device in FIG. 6. FIG. 14K gives the cross-section along the Y2-Y2' cross-section line in FIG. 9, of the final device, before metallization. FIGS. 14A-14D and 15A-15C describe the fabrication method of the high-density array shown in FIG. 10B, along the X-X' cross-section line, based on the memory device in FIG. 7E. FIG. 15D gives the cross-section along the Y1-Y1' cross-section line in FIG. 10B, of the final device, before metallization.

Figure 14A:
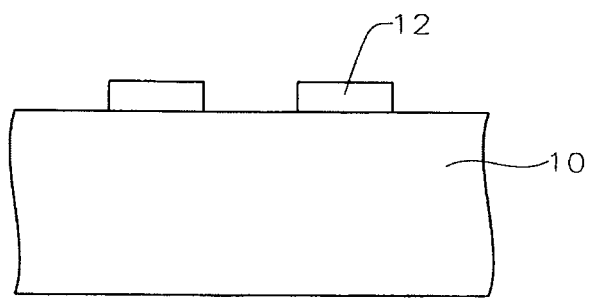
FIGS. 14A-14K are cross-sectional representations of a method of memory array fabrication according to a preferred embodiment of the present invention.
Figure 14B:
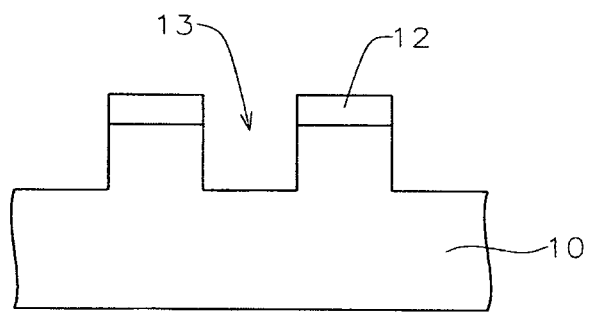

FIGS. 14A-14D show conventional process steps prior to memory formation. FIG. 14A illustrates the silicon substrate 10 over which a thick silicon nitride mask, for example, 12 has been formed. Trenches 13 are etched into the silicon substrate 10 not covered by the mask 12, as shown in FIG. 14B.

Figure 14C:
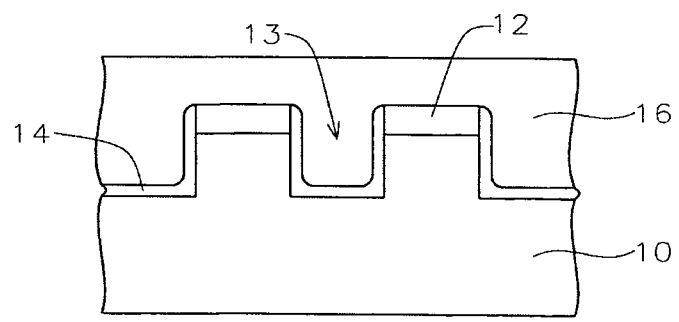
Figure 14D:
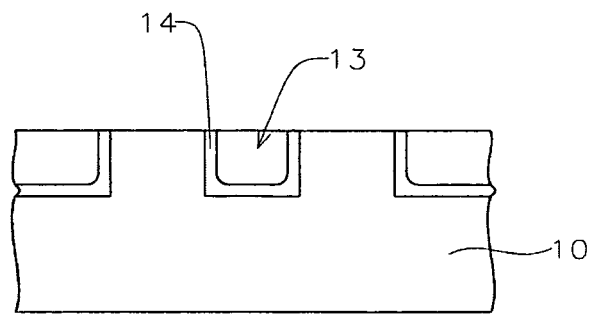

Referring now to FIG. 14C, liner oxidation is performed to form about 10 nm of oxide 14 on the sidewalls of the trenches 13. Next, the trenches are filled with silicon dioxide 16, for example. The silicon dioxide layer 16 is planarized, such as by chemical mechanical planarization (CMP) but the silicon nitride mask 12 remains (because it was thick to begin with), as shown in FIG. 14D.

Figure 14E:
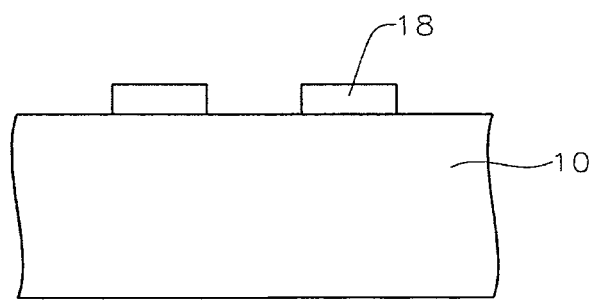
Figure 14F:
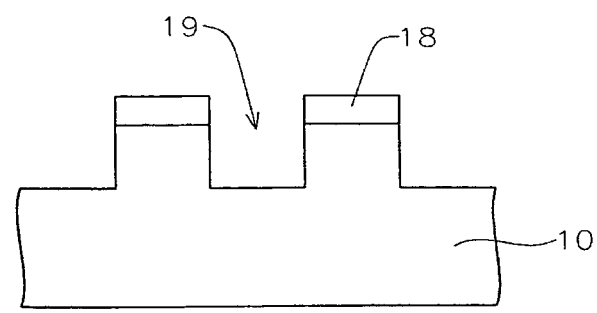
Figure 14G:
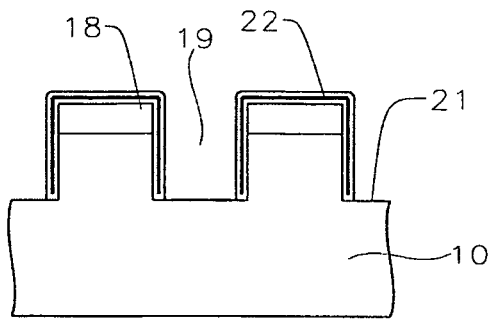

As another option, instead of reusing the nitride mask 12, a new gate trench mask 18 can be defined over substrate 10, as illustrated in FIG. 14E. Trenches 19 are etched into the substrate 10 not covered by the mask 18, as shown in FIG. 14F. The etch depth is about 100 nm. After trench etch, a conformal oxide with a thickness of about 4 nm is grown, followed by CVD of about 8 nm of nitride, which is further followed by conformal CVD of 5 nm $SiO_2$. Typically, silicon nitride is used as the trapping layer. Alternatively, Hafnium oxide, HfSiO, or other metal oxides could be used instead of silicon nitride. The resulting ONO layer 20 is then vertically etched and the memory nitride is formed on the silicon sidewall, exposing $SiO_2$ on the bottom surface of the trench 21, as shown in FIG. 14G.

Figure 14H:
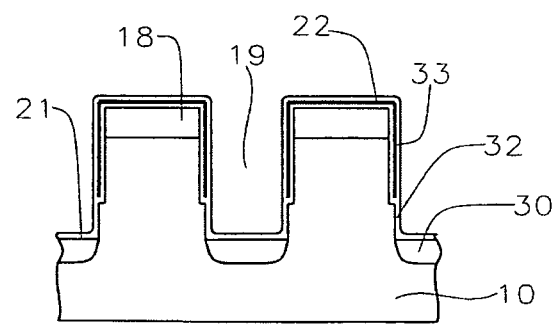

The silicon is etched again by about another 120 nm, and then the bottom source N+ junction 30 is formed by Arsenic implantation. The residue oxide on the SiN film is gently wet-etched and ISSG oxidation is implemented in order to grow about 5 nm of oxide from the nitride, which forms the trapping region 33 and 8 nm on the bulk silicon, which forms the non-trapping region 32, as shown in FIG. 14H.

Figure 14I:
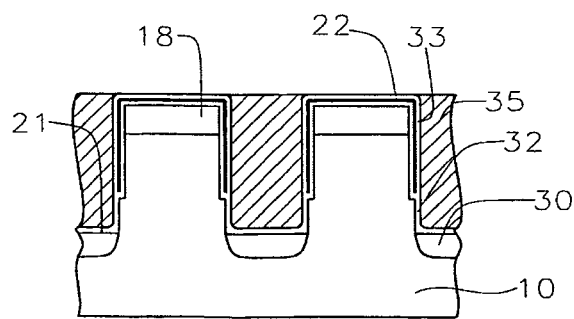

The trenches are filled with a conductive layer 35, such as arsenic-doped polysilicon or a refractory metal. The conductive layer is planarized by CMP or etch back, for example. The control gate (CG) poly is recessed about 15 nm from the original silicon surface, as shown in FIG. 14I.

Then the trench isolation mask is applied in the row-to-row space in order to isolate the drain regions between the rows of memory cells. The depth of this trench isolation mask is about 110 nm from the silicon surface, which should be sufficient to isolate the drain regions and the memory trapping regions, but still allow the vertical gates between rows of memory cells to be connected by polysilicon that is about 110 nm thick under the isolation trench area. The isolation trench and recessed region above the memory gate are filled with oxide and then planarized with CMP. The trench isolation regions 37 are shown in FIG. 14K, illustrating the cross-section along the Y2-Y2' cross-section line in FIG. 9 of the final device, before metallization.

Figure 14J:
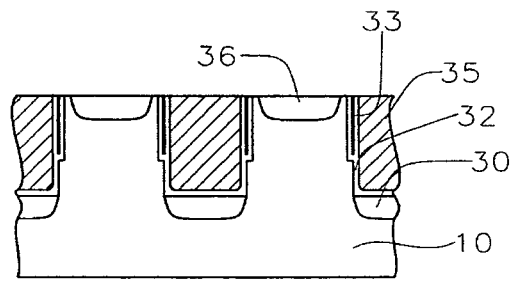
Figure 14K:
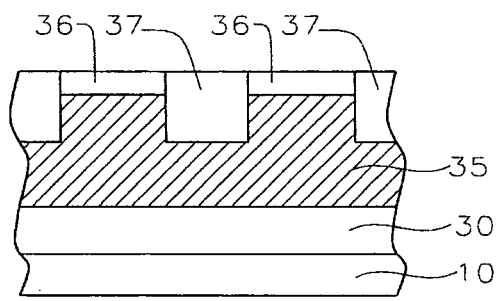

Next, the nitride (12 or 18) for the CMP etch stop is removed and the top drain regions 36 are formed by Arsenic implantation, as shown in FIG. 14J.

Memory gates 35 in FIG. 14J correspond to memory gates 631, 632, and 633 in FIG. 6. Likewise, drain regions 36 correspond to 621 and 622, source regions 30 correspond to 611, 612, and 613, the sidewall channel insulator regions 20 correspond to 641, 642, 643, and 644, and sidewall channel trapping layer 33 corresponds to 651, 652, 653, and 654. The top drain regions are contacted to metal or refractory metal by conventional BEOL processing.

For the source line connection, it is possible to connect through under the trench isolation by one extra masking step. Or it is also possible that the source line regions can be connected on a block level to another conductive layer such as a buried N+ in p-epi.

Figure 15A:
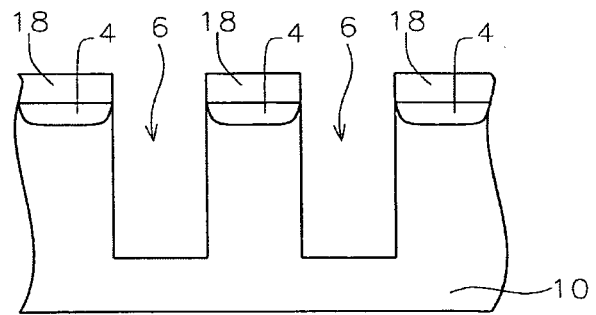
FIGS. 15A-15D are cross-sectional representations of another method of memory array fabrication according to a preferred embodiment of the present invention.
Figure 15B:
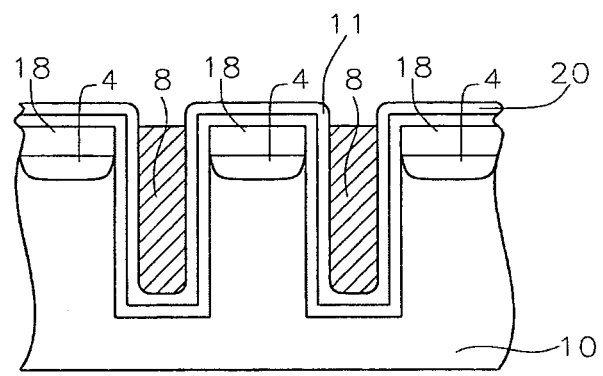

The high-density memory array as shown in FIG. 10B based on the memory device in FIG. 7E, shares the same initial process sequence as the high performance memory array, as given in FIGS. 14A-D. Referring now to FIG. 15A, before the memory gate trench 6 is formed, the top surface of the memory array is implanted with Arsenic 4 prior to forming the SiN/$SiO_2$ CMP etch stop 18. The trench 6 is etched into the substrate 10, not covered by mask 18, to an etch depth of about 250 nm. In FIG. 15B, vertical As+ is implanted to form the N+ junction 7 at the bottom of the trench 6 and then followed by thermal diffusion. The implant dosage, energy and thermal temperature and duration should be chosen so that the adjacent N+ junctions, which are separated by the thin body of about 50 nm or so, can be connected to each other.

Figure 15C:
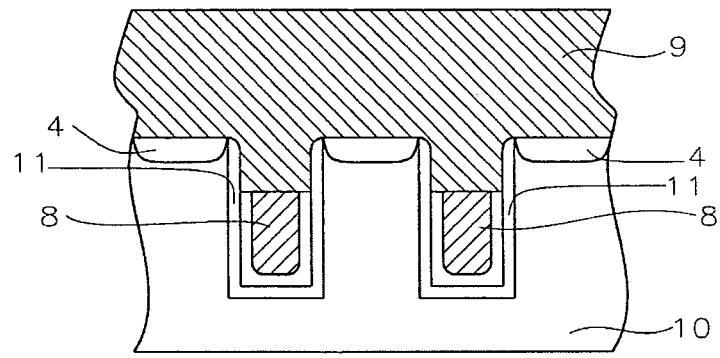
Figure 15D:
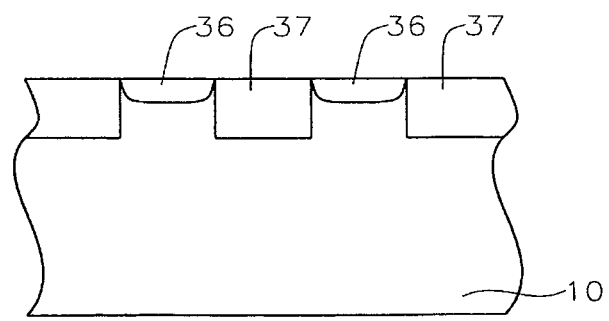

After forming the N+ junction 7 at the bottom of the trench, an oxide with a thickness of about 4 nm is grown, followed by CVD of about 8 nm of nitride, which is followed by ISSG oxidation of 5 nm $SiO_2$ on nitride to form the ONO sidewalls 11. Then As-doped polysilicon 8 for the trench fill is deposited and planarized as shown in FIG. 15B. If the ONO trapping region is to be formed near the source regions 7, the polysilicon 8 is then etched about 150 nm from the top silicon surface as shown in FIG. 15C. Then ONO on the exposed sidewall is removed and followed by 8 nm oxidation. If the entire sidewall is to contain the ONO trapping region, these etching and refilling steps are not performed. After this, the CG trench is filled by As doped word gate polysilicon 8 and planarized.

Next, the word gate cut mask is applied and word gate (WG) polysilicon 9 is etched into to the CG polysilicon surface; thus the WG poly is isolated row-to-row. Then CVD $SiO_2$ is deposited and etched back to expose the WG polysilicon surface. Then a conductive layer, such as polysilicon or refractory metal is deposited and connects the word gates in a row 9. Thus the CG and bit lines run in a y-direction and are orthogonal to the WG running in the x-direction. The bottom source diffusion may also run in the same direction as the word line, or be connected on a block level.

FIG. 15D gives the cross-section along the Y1-Y1' cross-section line in FIG. 10B of the final device, before metallization. Trench isolation 37 is shown in FIG. 15D.

The present invention describes a charge trap type of memory having a memory channel with vertical and possibly horizontal components. The invention includes fabrication methods for high-density memory arrays and high speed memory areas as well as new operational methods.

Although the preferred embodiment of the present invention has been illustrated and described in detail, it will be readily understood by those skilled in the art that various modifications may be made therein without departing from the spirit of the invention or from the scope of the appended claims.

What is claimed is:

1. A memory device comprising:
   two vertical memory gates formed in a first direction;
   a silicon substrate sandwiched between said two vertical memory gates wherein a face of said silicon substrate between said silicon substrate and said memory gate forms a memory gate channel region;
   source regions underlying said two vertical memory gates;
   drain regions in a top portion of said silicon substrate;
   a trench isolation formed between said drain regions in a second direction which provides isolation from an adjacent memory device in said second direction wherein a depth of said trench isolation is less than a depth of said vertical memory gates; and
   memory gate channel oxide formed between each said source region and said drain region and between each said memory gate and said silicon substrate wherein said memory gate channel oxide comprises a first vertical trapping region adjacent to a top vertical portion of said memory gate and a second vertical non-trapping region adjacent to a bottom vertical portion of said memory gate and a horizontal non-trapping region and wherein holes and/or electrons may be stored in said first vertical trapping region.

2. The memory device according to claim 1 wherein said first vertical trapping region is adjacent to said drain region and said second vertical non-trapping region and said horizontal non-trapping region are adjacent to said source region.

3. The memory device according to claim 1 wherein said memory gate channel oxide comprises two layers of silicon dioxide sandwiching a trapping layer comprising silicon nitride, hafnium oxide, hafnium silicon dioxide, or other metal oxides.

4. The memory device according to claim 1 wherein said memory gate channel region is completely vertical.

5. The memory device according to claim 1 wherein said memory channel region has a width of less than 50 nm.

6. A high speed memory array comprising:
   a plurality of memory devices according to claim 1 organized in columns and rows;
   a bit line connecting said drain regions alternately and running in said first direction;
   a control gate line connecting said vertical memory gates and running in said second direction; and
   a source line connecting said source regions and running in said second direction, parallel to said control gate line.

7. The memory array according to claim 6 wherein each memory gate is used to store individual data that is independent of the state of the opposing memory gate in an opposing pair of memory gates sharing a said drain region.

8. The memory array according to claim 6 wherein two opposing memory gates sharing a said drain region are used as a complementary pair to store data in a complementary manner.

9. A simultaneous complementary program and erase operation on a pair of memory gates comprising:
   providing a memory device according to claim 8;
   simultaneously programming and erasing said pair of vertical memory gates comprising:
     biasing said shared drain with a first positive voltage; and
     biasing said pair of vertical memory gates with opposite polarity wherein a high electric field is created in said memory gate channel, wherein electrons and holes generated by impact ionization are drawn to their corresponding gates according to the polarity of the gate, and wherein electron and hole injection are achieved simultaneously.

10. A memory device comprising:
    two vertical memory gates formed in a first direction;
    a silicon substrate sandwiched between said two vertical memory gates wherein a face of said silicon substrate between said silicon substrate and said memory gate forms a memory gate channel region;
    source regions underlying said two vertical memory gates;
    drain regions in a top portion of said silicon substrate;
    a trench isolation formed between said drain regions in a second direction which provides isolation from an adjacent memory device in said second direction, wherein a depth of said trench isolation is less than a depth of said vertical memory gates; and
    memory gate channel oxide formed between each said source region and said drain region and between each said memory gate and said silicon substrate wherein said memory gate channel oxide comprises a first trapping region and a second non-trapping region and wherein holes and/or electrons may be stored in said first trapping-region.

11. The memory device according to claim 10 wherein said first trapping region is adjacent to said drain region and said second non-trapping region is adjacent to said source region.

12. The memory device according to claim 10 wherein said memory gate channel oxide comprises two layers of silicon dioxide sandwiching a trapping layer comprising silicon nitride, hafnium oxide, hafnium silicon dioxide, or other metal oxides.

13. The memory device according to claim 10 wherein said memory gate channel region is completely vertical.

14. The memory device according to claim 10 wherein said memory channel region has a width of less than 50 nm.

15. A high speed memory array comprising:
    a plurality of memory devices according to claim 10 organized in columns and rows;
    a bit line connecting said drain regions alternately and running in said first direction;
    a control gate line connecting said vertical memory gates and running in said second direction; and
    a source line connecting said source regions and running in said second direction, parallel to said control gate line.

16. The memory array according to claim 15 wherein each memory gate is used to store individual data that is independent of the state of the opposing memory gate in an opposing pair of memory gates sharing a said drain region.

17. The memory array according to claim 15 wherein two opposing memory gates sharing a said drain region are used as a complementary pair to store data in a complementary manner.

18. A simultaneous complementary program and erase operation on a pair of memory gates comprising:
    providing a memory device according to claim 17;
    simultaneously programming and erasing said pair of vertical memory gates comprising:
      biasing said shared drain with a first positive voltage; and
      biasing said pair of vertical memory gates with opposite polarity wherein a high electric field is created in said memory gate channel, wherein electrons and holes generated by impact ionization are drawn to their corresponding gates according to the polarity of the gate, and wherein electron and hole injection are achieved simultaneously.

* * * * *